United States Patent [19]

Weenink

[11] 3,913,041

[45] Oct. 14, 1975

[54] RADIO RECEIVER OR TELEVISION RECEIVER WITH PRE-SELECTION TUNING

[75] Inventor: Leon Pieter Weenink, Eindhoven, Netherlands

[73] Assignee: U.S. Philips Corporation, New York, N.Y.

[22] Filed: May 30, 1974

[21] Appl. No.: 474,807

[30] Foreign Application Priority Data

June 14, 1973 Netherlands ....................... 7308241

[52] U.S. Cl. ......................... 334/7; 200/46; 334/15; 334/39; 334/89

[51] Int. Cl.$^2$ ....................... H03J 5/08; H01H 41/12

[58] Field of Search ............... 334/7, 15, 39, 47, 89; 200/46; 323/80

[56] References Cited

UNITED STATES PATENTS

| | | | |
|---|---|---|---|
| 2,784,369 | 3/1957 | Fenemore et al. | 323/80 |
| 3,138,754 | 6/1964 | Roessler, Jr. | 334/15 |
| 3,586,805 | 6/1971 | Ziegler, Jr. | 200/46 |
| 3,593,152 | 7/1971 | Aoki | 334/7 |
| 3,699,496 | 10/1972 | Witcher | 200/46 |

*Primary Examiner*—Alfred E. Smith

*Assistant Examiner*—Wm. H. Punter

*Attorney, Agent, or Firm*—Frank R. Trifari; Henry I. Steckler

[57] ABSTRACT

A radio receiver or television receiver comprising a manually adjustable switching member for binary coded pre-selection tuning. A display provides a pattern which is to be transferred to the switching member and which represents a selected frequency in binary form.

3 Claims, 3 Drawing Figures

RADIO RECEIVER OR TELEVISION RECEIVER WITH PRE-SELECTION TUNING

The invention relates to a radio receiver or television receiver with pre-selection tuning, comprising a tuning member which can be step-wise adjusted, the stepwise tuning being achieved by means of a plurality of tuning means which can be switched on according to binary code combinations.

A known device (Funkschau 1971, Heft 17, pages 535–537) comprises a binary-operating electronic tuning device in which a core store matrix is used for the pre-selection of a number of stations which can be switched on by means of pushbuttons. The invention has for its object to provide a cheaper device for the pre-selection tuning.

According to the invention, the pre-selection tuning is achieved by means of at least one pre-selection switching member, comprising a plurality of manually adjustable operating elements for switching on the tuning means in accordance with a code combination which is preselected by adjustment of the operating elements, the spatial arrangement of the operating elements in the switching member essentially corresponding to that of the indicating elements of a binary display which displays the binary code combination associated with each tuning and which enables the manual transfer of the combination to the switching member.

A simple embodiment according to the invention is illustrated in the drawing.

Figure 1:
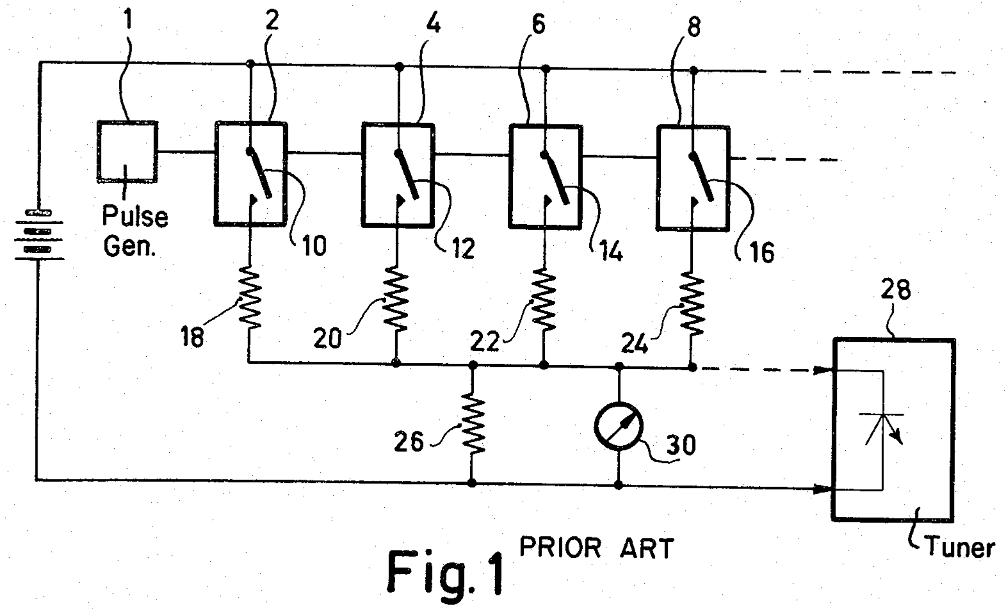
Fig. 1 PRIOR ART
FIG. 1 shows a known circuit which can be used therein.

The known tuning circuit which is shown in principle in FIG. 1 comprises a pulse generator 1 which, after actuation of a start switch (not shown), applies pulses to a so-termed binary counter, consisting of a series of, for example, 10 bistable multivibrators (flip-flops; four flipflops, numbered 2, 4, 6 and 8, are shown, each of which applies each second pulse received to the next flipflop in known manner. Each of the flipflops 2–8 comprises a contact 10, 12, 14 and 16, respectively, which is atternately closed and opened upon reception of a pulse. These contacts are capable of connecting a number of resistors 18–24 mutually parallel and in series with a fixed resistor 26 according to a continuously changing binary combination. If the resistance of the resistors 18–24 relates approximately as 1 : 2 : 4 : 8 and is large with respect to the value of resistor 26, a stepwise increasing voltage can be derived from the latter and be applied to a capacitive diode tuner 28; an indication of the tuning can be obtained, for example, by means of a voltmeter 30 comprising a frequency-calibrated scale. The circuit can furthermore comprise a section (not shown) which transmits a stop signal to the pulse generator 1 when a strong transmitter is encountered (so-termed automatic scan tuning).

Figure 2:
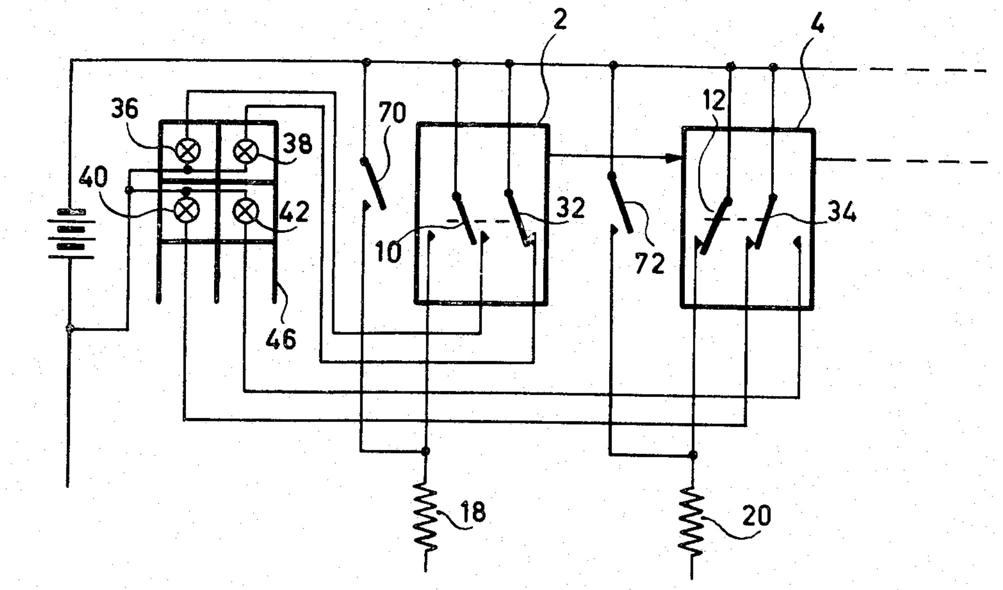
FIG. 2 shows a part of the same circuit after addition of elements which are essential to the invention.

Each of the flipflops 2–8 (FIG. 2 shows the first two flipflops by way of example) comprises, in addition to the contact 10, 12, respectively, a make-and-brake contact 32, 34, respectively, which connects one of two signal lamps 36 and 38, 40 and 42, respectively, to a current source in accordance with the position of the contact 10, 12, respectively. The signal lamps are combined to form a display 46 which clearly displays the binary combination determining the tuning at any given instant.

Figure 3:
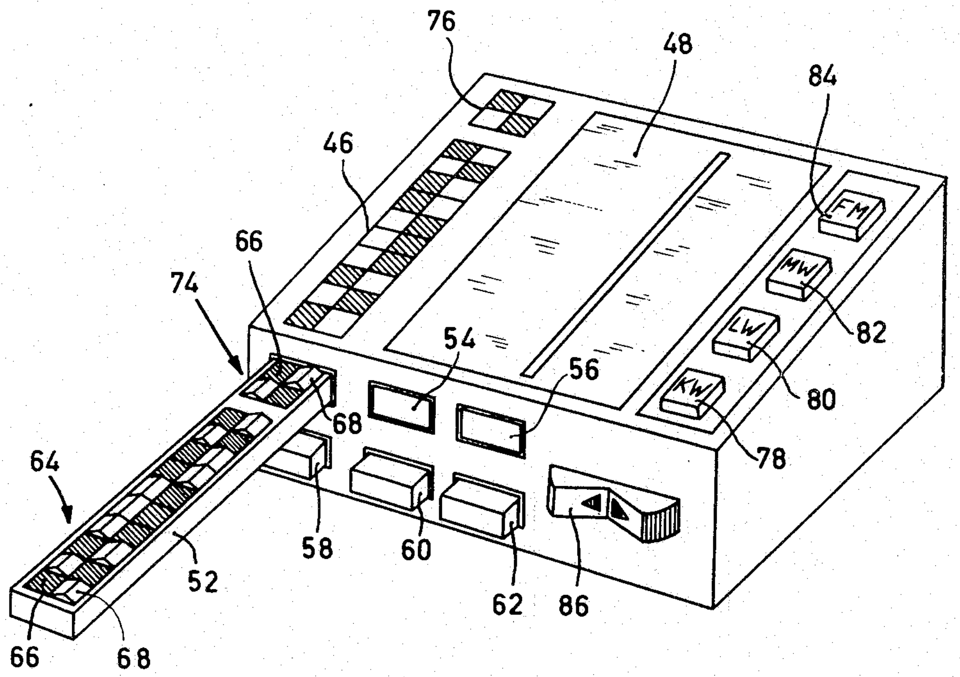
FIG. 3 shows the structural characteristics of this embodiment.

In the receiver shown in FIG. 3 the display 46 is arranged in a conspicuous place, for example, adjacent the scale 48 of the voltmeter 30. The receiver furthermore comprises a number of sliding drawers 52–56, each drawer having an associated pushbutton 58, 60, 62, respectively, for switching on. Each of the drawers can be completely slid out of the receiver — as is shown in FIG. 3 — and comprises a section 64 which substantially corresponds to the display 46 as regards shape as well as dimensions. The section 64 is filled with loose blocks of an insulating material which are transverse arranged. Each block comprises on its upper side a dark portion 66 and a light portion which is provided with a movable raised portion 68 so as to simulate each time two adjacent portions — one of which is always dark — of the display 46. This arrangement readily enables a binary code combination which corresponds to a given tuning and which is displayed by the display 46 to be transferred by hand to the section 64 of one of the drawers 52–56, for example, to that of the drawer 52 by moving portion 68 to the left or right. In the slid-in position of each of the drawers 52–56, a contact 70, 72, respectively, is situated over each of the ten portions which are situated to the left of the centre of the drawing (see FIG. 2); this contact is closed, for example, upon depression of the button 58 if a raised portion 68 is present in the relevant portion. This means that the contacts having a "dark" portion 66 situated underneath are not closed.

The receiver comprises a switching device (not shown) which is coupled to the pushbuttons 58–62 and which ensures that, as soon as one of the buttons is depressed, the contacts 10, 12 etc. are opened or otherwise rendered inactive. The binary combination according to which the resistors 18, 20, etc. are connected in the circuit is then exclusively determined by the contacts 70, 72 etc. associated with the depressed button and its drawer (the contacts 70 of all drawers can be connected in parallel, and all contacts 72 likewise etc.) Each drawer constitutes a "storage matrix" by means of which a station defined therein can be immediately selected. If desired, the drawer itself can also act as a pushbutton; the buttons 58–62 can then be dispensed with. The blocks comprising a raised portion 68 in the drawers 52–56 can have the size of only one field and can be laterally slidable in the drawer; the blocks can alternatively be replaced by tumbler switches comprising a tumbler button which is proportioned as large as the two fields together and performing the function of the contacts 70, 72 etc. It will be obvious that the blocks and switches can alternatively be arranged on the upper surface of the apparatus adjacent the display 46 instead of in drawers.

Each of the drawers 52–56 can also be provided with a second section 74 comprising, for example, two blocks 66–68 which can operate a set of contacts for selecting the wave range. The information required for setting the blocks can be derived from a second display 76 which is illuminated as soon as one of the wave range buttons 78–84 is depressed. These buttons are normally used in combination with the knob 86 which serves for switching on the normal automatic scan tuning.

The described device can of course be advantageously used in receivers comprising electronic automatic scan tuning in which the required flipflops and the like are already present (the flipflops can be replaced, if desired, by a manually operated mechanical contact device). Application, however, is also possible in receivers comprising a different kind of tuning means to be switched on according to a binary code such as, for example, fixed capacitors of different value which are parallel connected according to binary code combinations.

What is claimed is:

1. A tuning circuit for a receiver with pre-selection tuning and a tuning member which can be step-wise adjusted, said tuning circuit comprising a plurality of tuning means for achieving said step wise adjustment which can be switched on according to binary code combinations, at least one pre-selection switching member comprising a plurality of manually adjustable operating element means for switching on the tuning means in accordance with a code combination which is preselected by adjustment of the operating element means, and a binary display having indicating elements which displays the binary code combination associated with each tuning frequency and which enables the manual transfer of the code combination of the switching member, the spatial arrangement of the operating element means substantially corresponding to that of said indicating elements.

2. A tuning circuit as claimed in claim 1, wherein said tuning means comprises a plurality of switching contacts, the switching member comprising a sliding drawer having said operating element means, said operating element means being block-like operating elements, each of which is capable of occupying two positions, each one of said operating elements operating a switching contact.

3. A tuning circuit as claimed in claim 2, said receiver incorporating capacitive diode tuning, wherein the tuning means are resistors which can be mutually parallel connected by the switching contacts and which can be connected in series with a fixed resistor from which the tuning voltage for the capacitive diode is derived.

* * * * *